(12) United States Patent
Mardi

(10) Patent No.: US 6,674,036 B1
(45) Date of Patent: Jan. 6, 2004

(54) METHOD FOR MARKING PACKAGED INTEGRATED CIRCUITS

(75) Inventor: Mohsen H. Mardi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 267 days.

(21) Appl. No.: 10/053,992

(22) Filed: Oct. 22, 2001

Related U.S. Application Data

(62) Division of application No. 09/366,427, filed on Aug. 2, 1999, now Pat. No. 6,359,248.

(51) Int. Cl.[7] .............................................. B07C 5/344
(52) U.S. Cl. ..................................... 209/573; 324/158.1
(58) Field of Search ................................. 209/573, 572; 324/158.1; 257/730, 773

(56) References Cited

U.S. PATENT DOCUMENTS

| | | |
|---|---|---|
| 4,985,988 A | 1/1991 | Littlebury |
| 5,539,692 A | 7/1996 | Kajigaya et al. |
| 6,359,248 B1 * | 3/2002 | Mardi ........................ 209/573 |

* cited by examiner

Primary Examiner—Kenneth W. Noland
(74) Attorney, Agent, or Firm—Lois D. Cartier

(57) ABSTRACT

The invention provides methods for marking packaged ICs. In a first embodiment, only the minimum performance information is first marked on the package, regardless of the actual performance of the IC. This method avoids a second marking step for all ICs sold as low-performance ICs. In another embodiment, only one inking and curing step is required for all ICs. According to this method, all specified performances are marked on the packaged IC at the first marking. The IC is then tested to determine the actual performance, and all performance markings not applicable to the IC are removed, preferably with a laser. Alternatively, all applicable performance markings are identified (e.g., underlined or enclosed with a laser marking).

14 Claims, 14 Drawing Sheets

(BOTTOM VIEW)

(TOP VIEW)

(TOP VIEW)

(TOP VIEW)

(TOP VIEW)

(TOP VIEW)

(TOP VIEW)

(TOP VIEW)

(TOP VIEW)

(TOP VIEW)

(TOP VIEW)

(TOP VIEW)

(TOP VIEW)

(TOP VIEW)

(TOP VIEW)

METHOD FOR MARKING PACKAGED INTEGRATED CIRCUITS

FIELD OF THE INVENTION

The invention relates to packaged integrated circuits (ICs). More particularly, the invention relates to a method for marking packaged ICs.

BACKGROUND OF THE INVENTION

ICs are normally "packaged" prior to sale, e.g., mounted in plastic or ceramic carriers that protect the IC. The IC package is then typically mounted on a circuit board, while "package pins" incorporated in the package allow electrical contact (through fragile internal "bond wires") between the pads of the IC and traces on the board. Commonly used packages include dual in-line (DIP) packages, ball grid arrays (BGA), and many other well-known packages.

Because many different ICs are generally available in a given package, packaged ICs are normally marked with both product tracking information and product identity information prior to sale. The product tracking information typically includes the wafer fabrication lot number and the date on which the wafer was fabricated, as well as the assembly lot number and the date on which the packaged IC was assembled. This information allows the manufacturer to track the manufacturing process and assists in solving manufacturing problems. Product identity information typically includes designations for the product type, package type, and performance (speed grade) of the IC.

FIG. 1 shows a common package marking flow. Typically, an IC device is tested briefly while still on the wafer (step 100). ICs failing the tests are discarded (step 102). ICs passing the tests are packaged (step 104), then marked on the back with product tracking information (step 106). After this step, the packaged IC looks as shown in FIGS. 1A (bottom view) and 1B (top view).

After the ink on the bottom of the package has cured, the package is marked on the front (step 108) with additional information intended for the customer, typically product identity information. Product tracking information may also be included. For example, as in FIG. 1C, a marked IC may display the company name and logo, an alphanumeric string including the product identity information (PRODUCTIDENTITY), and one or more strings including the product tracking information (PRODUCTTRACKING). FIG. 1D shows the marked information in more detail. The IC of FIG. 1D displays the product identity information in the form of a product designator (Prod), package identifier (pkg), and speed grade (spd-grade). Product tracking information includes the wafer lot, processing date, assembly lot, and assembly date.

Because the actual performance of the device is not known at this time, the highest specified performance is typically included on the front markings. Alternatively, the speed grade can be omitted from the markings, and added later after the performance has been determined.

The marked packaged IC is then subjected to further tests (step 110) to determine full functionality and performance. ICs failing the tests are discarded (step 112). If a speed grade was marked on the IC in step 108, then the ICs are tested against the marked speed grade. Otherwise functional ICs in any lower speed grade will fail the tests and must then be discarded. If no speed grade was marked on the IC in step 108, the actual, measured performance can be marked on the IC in a third marking step (not shown). Because marking is a slow and expensive process, it is common for IC manufacturers to simply mark the fastest speed grade and accept the losses of discarding slower ICs, for at least a portion of their output.

The fully tested and marked ICs are then stored until a customer order is received (step 114), at which time an IC is selected and shipped to the customer (step 116).

This straightforward process has several deficiencies. If each package is marked with the highest specified speed grade in step 108, some slower devices must be unnecessarily discarded. If the speed grade is not marked until later in the process, a total of three marking steps must be performed. Even in this case, the fabrication, testing, and marking process may result in a distribution of ICs that does not correspond to the distribution desired by customers. For example, a fast IC is typically more expensive than a corresponding slow IC. Therefore, customers who do not need fast ICs are not willing to pay a premium for them, yet the fabrication, testing, and marking process may result in a large number of ICs marked "fast" and a small number of ICs marked "slow". In this case, it is common industry practice to sell a fast IC at the price of a slow IC, and in these circumstances it is desirable to mark the IC package with the speed grade for which the customer paid, not the speed grade at which the packaged IC functioned when tested. Further, customers sometimes wish to purchase unusual combinations of, for example, speed grades and temperature ranges, or even to purchase speed grades or temperature ranges not normally tested for. In this case, a manufacturer can easily test the product to the customer's specifications. However, the product has already been marked in a fashion that may not be consistent with the customer's needs. Therefore, it is not uncommon for a manufacturer to deliberately remove product identity markings and replace them with new product identity markings.

The marking removal process typically involves sanding, sandblasting, a covering of paint, or laser ablation, and can for some inexpensive ICs cost more than the IC itself. Further, the physical handling of the package necessary to remove the markings can cause damage to the fragile bond wires within the package. In fact, in the case of thin packages, the potential damage is such that some of these processes cannot be used.

In addition, sanding and sandblasting mar the finish of the package, which may be unacceptable to the customer. Painting the package is sometimes messy, and often does not fully hide the previous mark due to a textural difference between the bare package and the raised surface of the marking. This overcoat can also fail over time to adhere to the package, or can be found cosmetically unacceptable to the customer. Laser removal also mars the finish of the package and may be cosmetically unacceptable.

In order to avoid the potentially expensive and damaging step of removing product identity markings, one known marking method delays adding the product identity markings until after determining the customer's needs. This process is illustrated in FIG. 2. The product tracking information is marked on the back of the packaged IC as in FIG. 1 (step 106). The product identity information is not marked on the package at this time. The packaged IC is then tested (step 208) to determine the actual tested performance of the IC. Any IC not meeting a minimum specified performance, or not passing the functional tests, is discarded. The IC is then "binned"(i.e., stored, typically in a marked bin) according to the actual performance of the IC (step 212). The partially marked packaged IC is held until a customer order is received (step 214) and a suitable IC is selected (step 216). A suitable IC may be an IC either meeting or exceeding the customer's performance requirements. In some cases, especially where the customer has non-standard requirements, additional testing is performed at this point in the process to verify the suitability of the selected device. The product identity information appropriate to the sale is then marked on the top side of the selected packaged IC (step 218) and the IC is delivered to the customer (step 220).

In a variation on the method of FIG. 2, after step 106, all product identity information except for the speed grade is marked on the front of the package. The packaged IC is the tested as in step 208 of FIG. 2, and the passing ICs are binned as in step 212. The partially marked packaged IC is held until a customer order is received (as in step 214) and a suitable IC is selected (as in step 216). The speed grade appropriate to the sale is then added to the markings on the top side of the selected packaged IC (similar to step 218) and the IC is delivered to the customer (step 220).

These methods are less expensive than removing and replacing the product identity markings. However, the methods of FIG. 2 still require two or three marking steps. The more marking steps, the slower the packaging process, as marking and curing the ink takes more time than most packaging steps. Further, the increased physical contact increases the likelihood of physical damage to the IC. Additionally, between receiving an order and shipping the IC the IC must be marked with ink and the ink must be cured, preferably followed by testing in case of damage during the marking process. Thus, these methods consume additional time and slow down the delivery process. Therefore, it is desirable to provide a method for marking packaged ICs that avoids the expense of removing applied markings, minimizes the number of marking steps, and avoids the necessity for inking the package after receiving a customer order.

SUMMARY OF THE INVENTION

The invention provides a method for marking a packaged IC in which only the minimum performance information is first marked on the package, regardless of the actual performance of the IC. The packaged IC is then tested to determine its actual performance. If the IC is a minimum performance device, no further marking step is required. Thus, a second marking step is avoided for all low-performance ICs. If the IC meets a performance standard above the minimum standard, then the actual speed grade is marked on the package in a second marking step. In a first such embodiment, all applicable speed grades are marked in the second marking step. The device can then be sold as any of the marked speed grades. In another such embodiment, the packaged IC is tested and marked with one or more speed grade ranges encompassing all standard performance combinations for which the IC is found to be suitable. (There may be more than one speed grade range, for example, if the IC has a potentially different speed grade at different operating temperatures.) In other words, the minimum performance and the actual measured performance are marked to form a range of performance values for which the IC is suitable. The IC can then be sold as any performance within any of the marked ranges.

The invention further provides a method for marking packaged ICs in which only one inking and curing step is required for all ICs. According to this method, all specified performances are marked on the packaged IC at the first marking. The IC is then tested to determine the actual performance, and all performance markings not applicable to the IC are removed, preferably with a laser. For example, all performances faster than the actual performance are removed. This method does require a removal step, but advantageously avoids a second inking step. Because no remarking is required after removal, and because the laser does not need to make physical contact with the IC package, this method is safer and less expensive than known methods. In a variation on this method, all performance markings remain intact, but all applicable performance markings are identified (e.g., underlined or enclosed with a laser marking). For example, all performances equal to or slower than the actual performance are identified.

A laser is much less likely to damage an IC than other known marking methods. Further, the laser process is much faster than the inking and curing process. Therefore, it is feasible to use a laser to make changes to IC package markings after receiving a customer order. Accordingly, the invention provides a method in which all specified performance combinations are marked on the packaged IC at the first marking. The IC is then tested to determine the actual performance, and the IC is binned according to its actual performance. After receiving a customer order, an appropriate IC is selected and all performance markings except those desired by the customer are removed with a laser. In another embodiment, the desired performance marking is identified (e.g., underlined or enclosed with a laser marking).

BRIEF DESCRIPTION OF THE DRAWINGS

The present invention is illustrated by way of example, and not by way of limitation, in the following figures, in which like reference numerals refer to similar elements.

Figure 1:
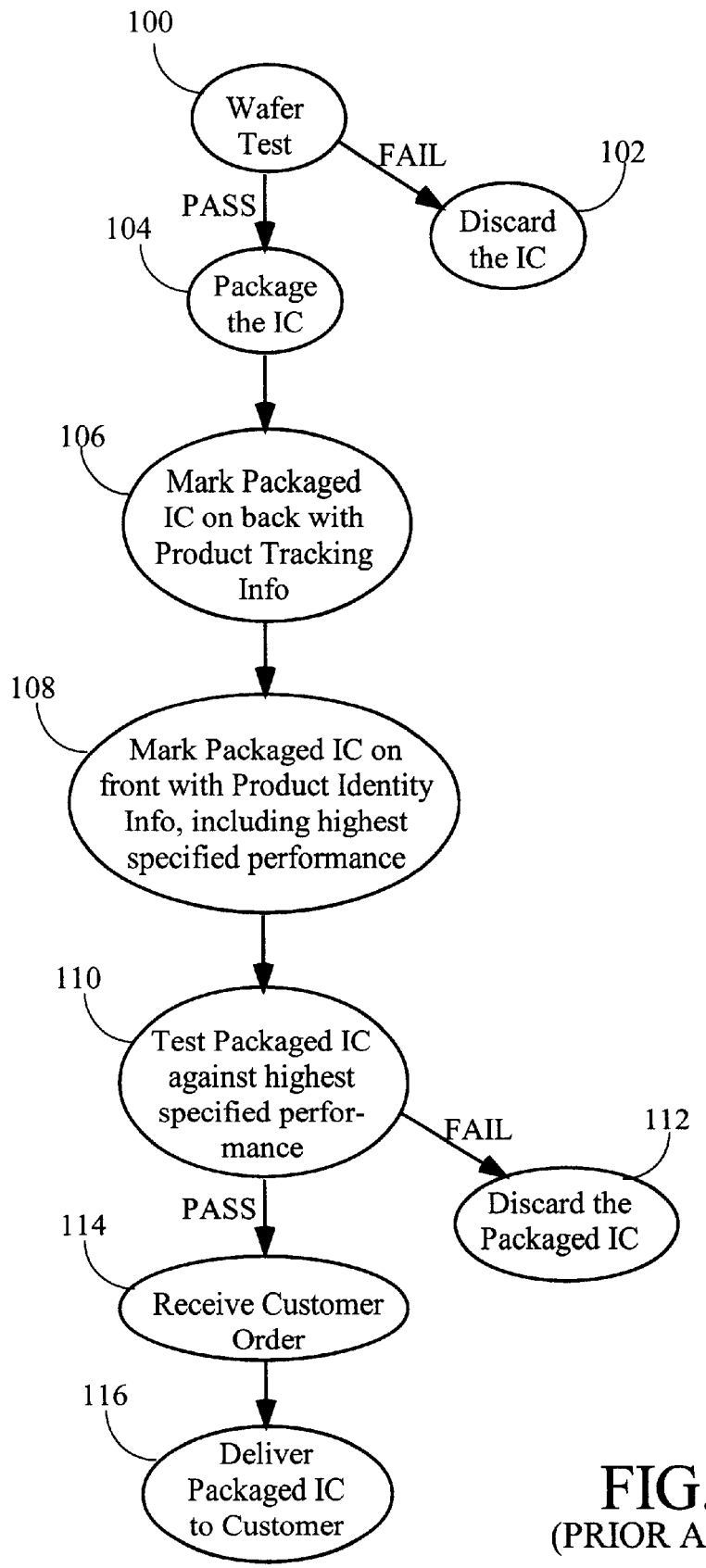
FIG. 1 shows the steps of a first known method for marking a packaged IC.
Figure 1A:
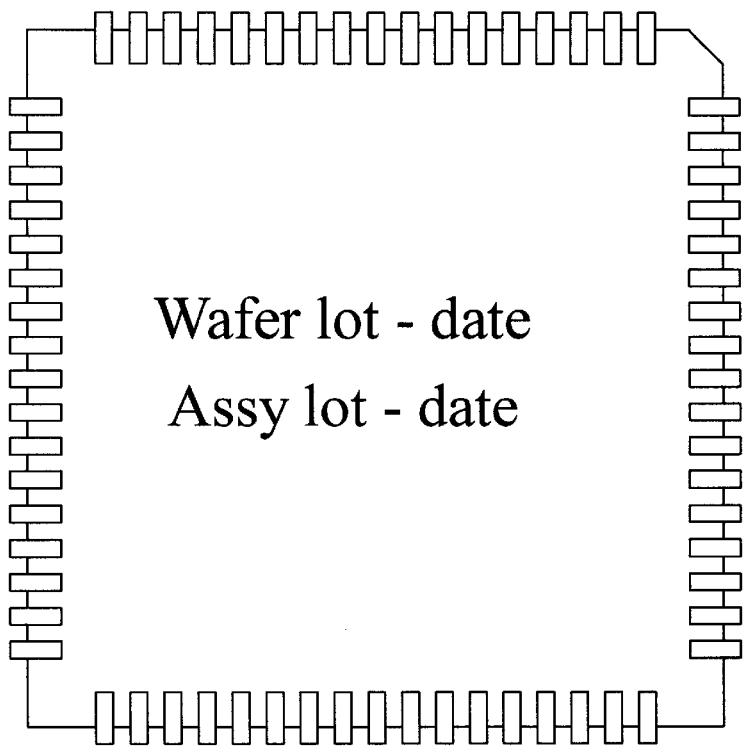
FIGS. 1A and 1B show the bottom and top sides, respectively, of a packaged IC after marking with product tracking information according to the method of FIG. 1.
Figure 1B:
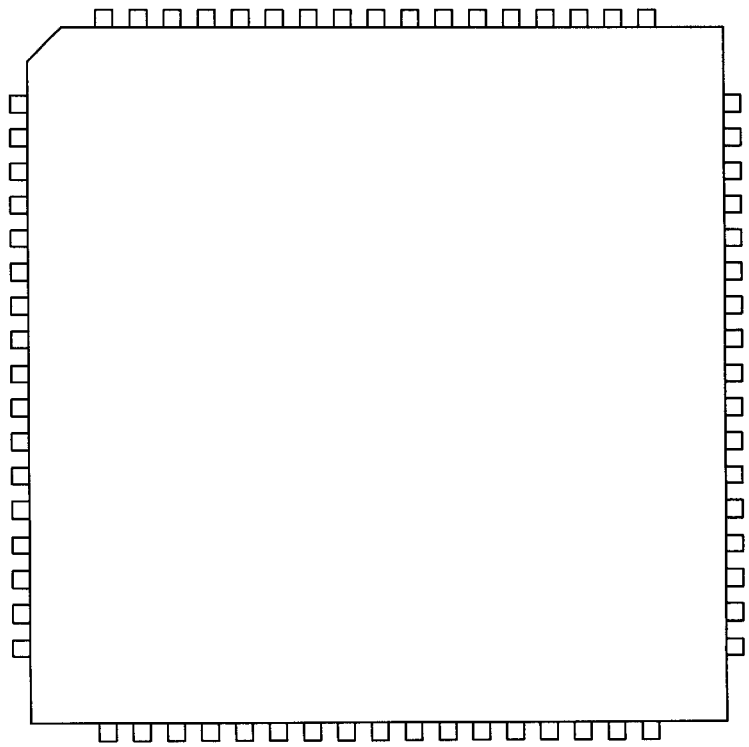
Figure 1C:
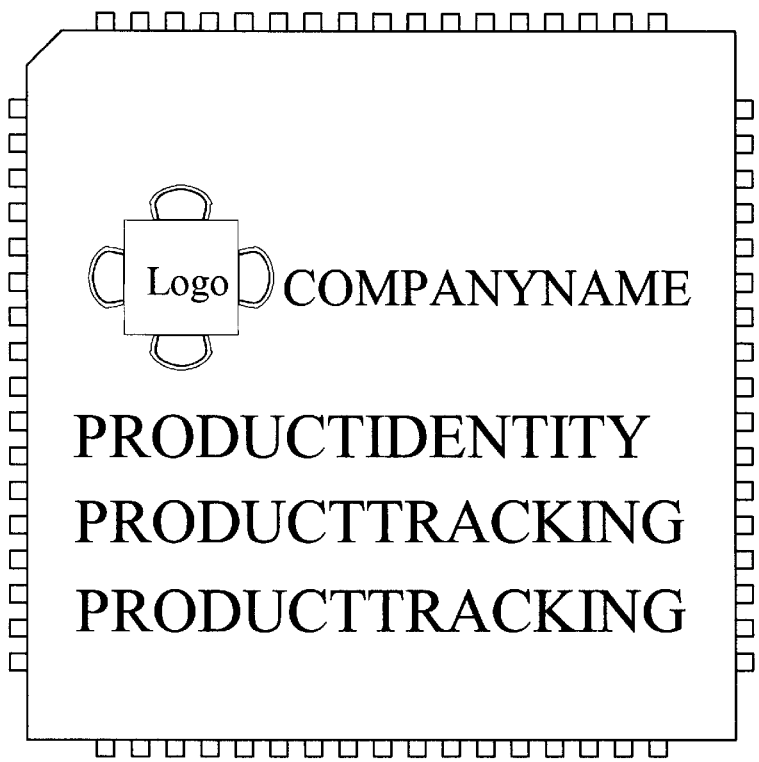
FIG. 1C shows the top side of a packaged IC and indicates the information that may be marked on the package according to the method of FIG. 1.
Figure 1D:
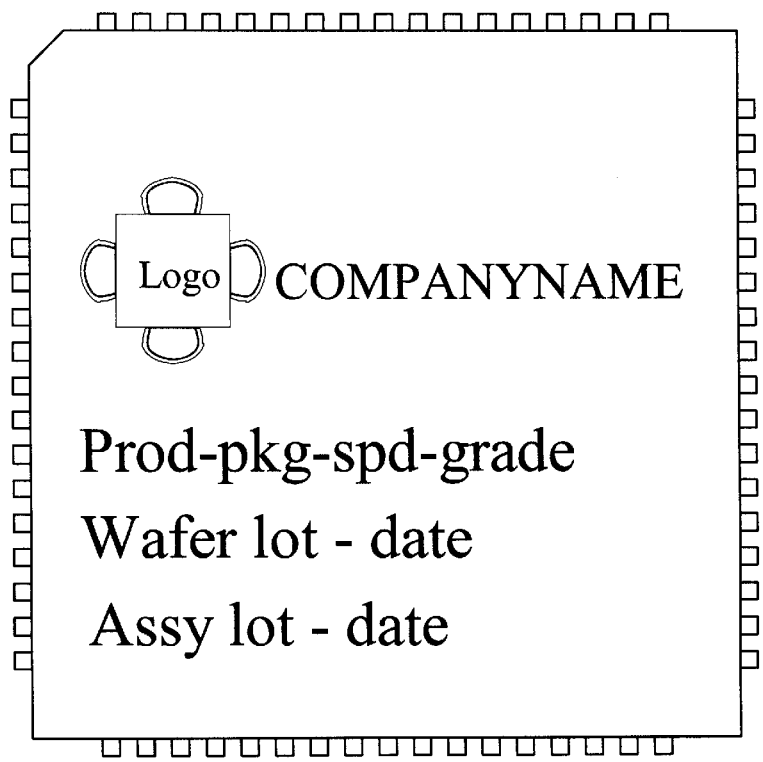
FIG. 1D shows the information on the packaged IC of FIG. 1C in greater detail.
Figure 2:
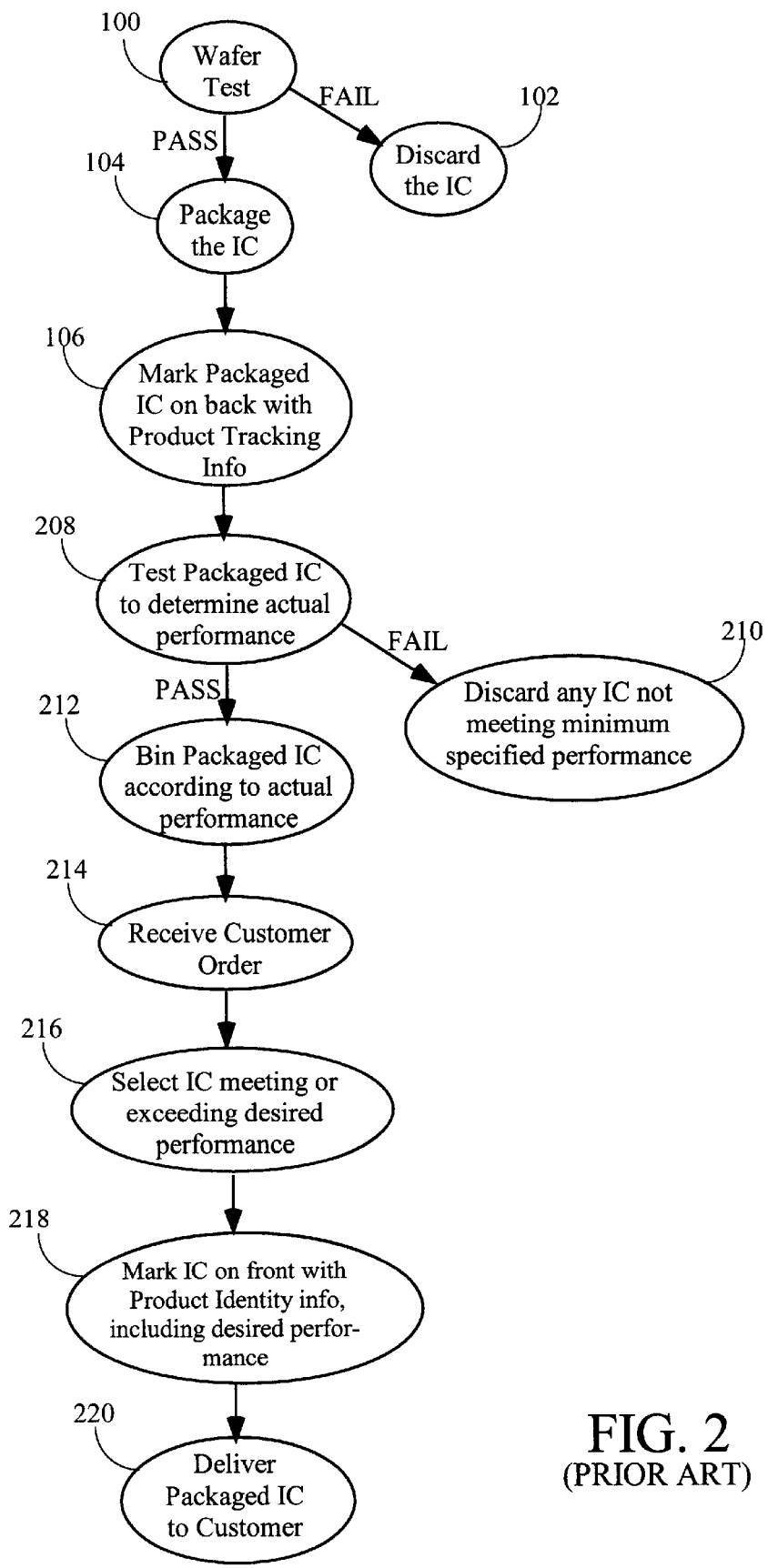
FIG. 2 shows the steps of a second known method for marking a packaged IC.

While the invention is susceptible to various modifications and alternative forms, specific embodiments thereof have been shown by way of example in the drawings and are described herein in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Figure 3:
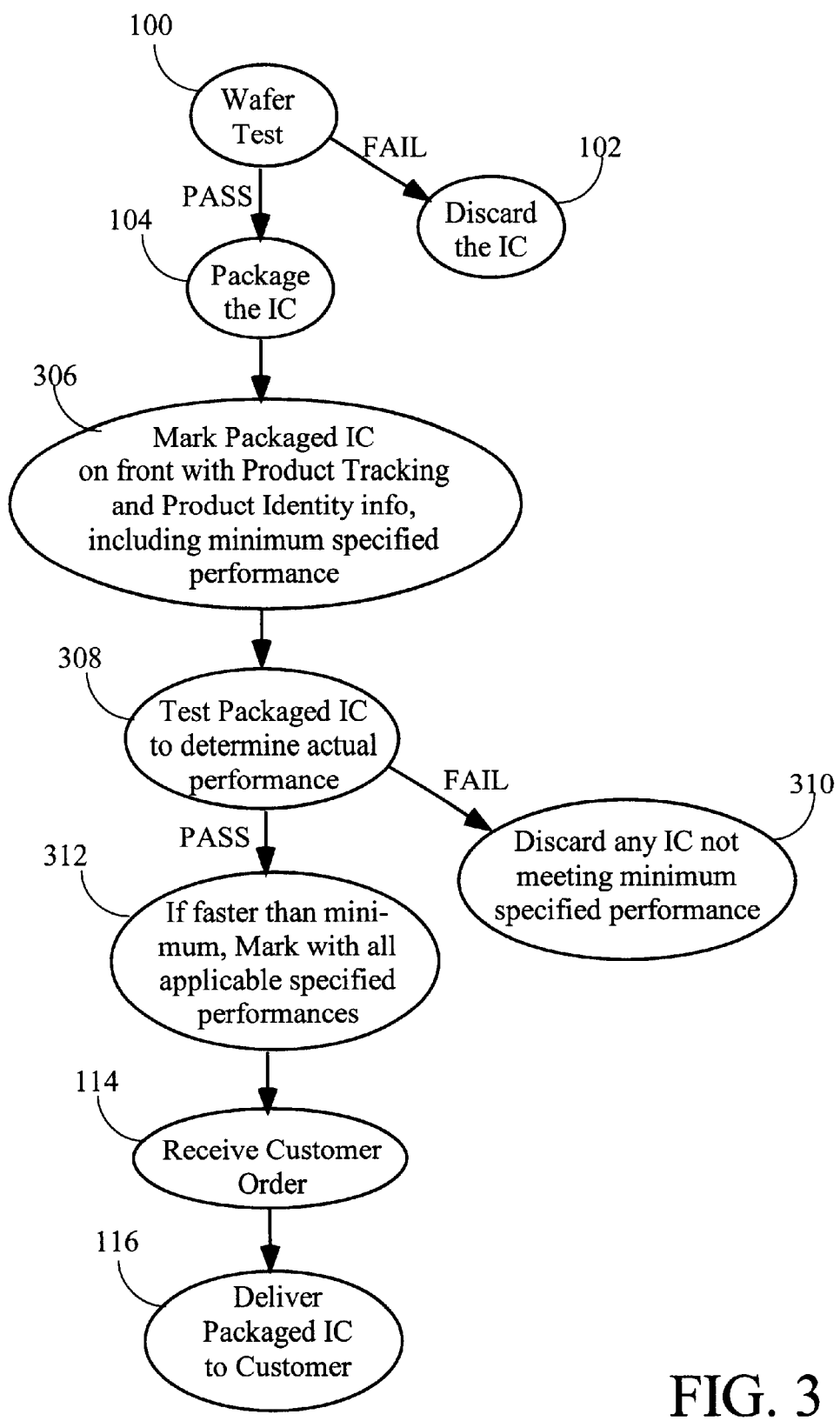
FIG. 3 shows the steps of a method for marking a packaged IC according to one embodiment of the invention.

FIG. 3 shows a method for marking packaged ICs according to a first embodiment of the present invention. This method avoids a second marking step for all ICs sold as low-performance ICs.

Figure 3A:
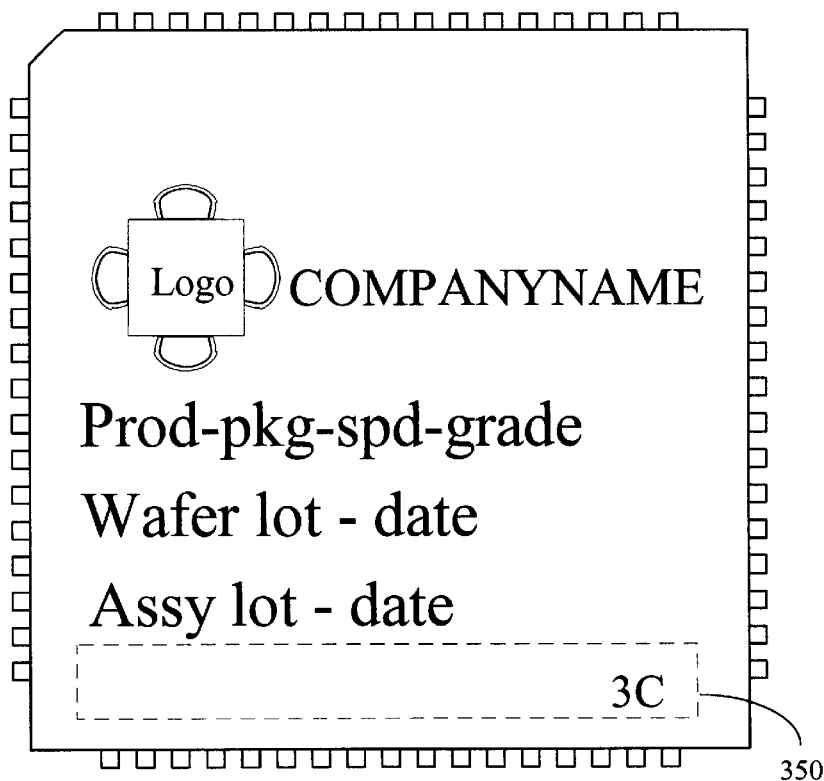
FIG. 3A shows the top side of a packaged IC after the first marking step in the method of FIG. 3.

The initial steps of FIG. 3 are similar to those of FIG. 1, and therefore are not described. At step 306, those packaged ICs passing the packaged IC tests (step 104) are marked with the product tracking and product identity information, preferably on the top of the package as shown in FIG. 3A. (In other embodiments, the product tracking information is marked on the back of the package, as in the prior art method of FIG. 1.) The actual performance information appropriate for this particular packaged IC is not yet known and is not marked on the packaged IC at this time. Instead, the package is marked with the minimum specified "performance" of the packaged IC product, i.e., a code representing the minimum performance IC sold as a standard product. After this step, the packaged IC resembles, for example, FIG. 3A, where the area 350 is reserved for performance information and the code "3C" corresponds to an IC with speed grade "3" and temperature range "commercial". For this exemplary IC, "1" is the fastest standard speed grade and "3" is the slowest. (Temperature ranges are commonly specified as "commercial" (C), "industrial" (I), and "military" (M). Temperature ranges are well known and therefore are not discussed here in detail.)

The marked packaged IC is then tested (step 308) to determine the actual performance. TCs failing to meet the minimum specified performance are discarded (step 310). ICs exceeding the minimum specified performance are marked in a second marking step (step 312) with all performances (e.g., speed grades) for which they qualify. ICs meeting but not exceeding the minimum specified performance do not need further marking.

Figure 3B:
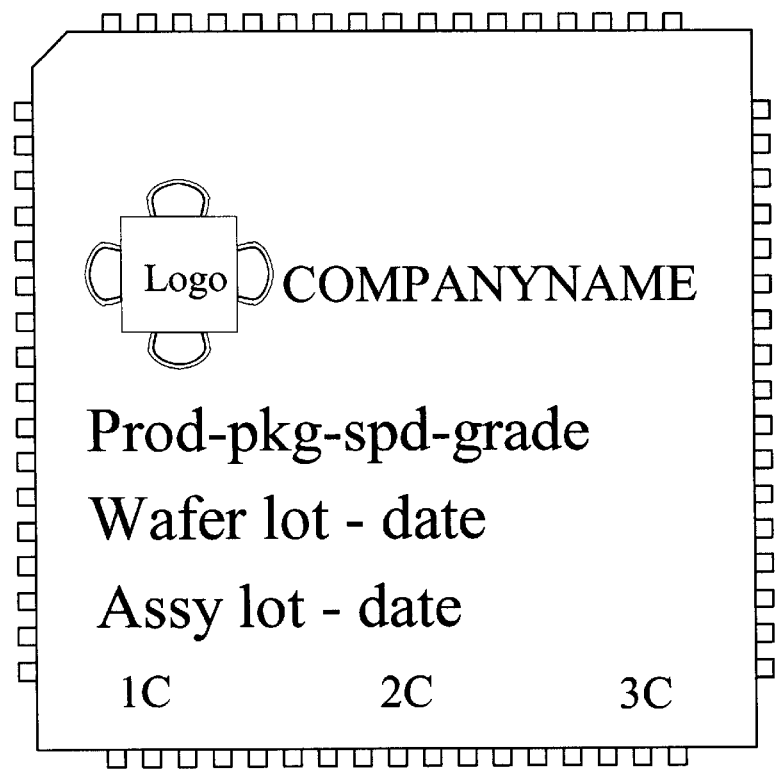
FIG. 3B shows the packaged IC of FIG. 3A after completing the method of FIG. 3.

FIG. 3B shows the top side of a packaged IC marked (as in step 312) with all performances for which it qualifies. This particular IC can be sold as either a 1C, 2C, or 3C product.

Figure 4:
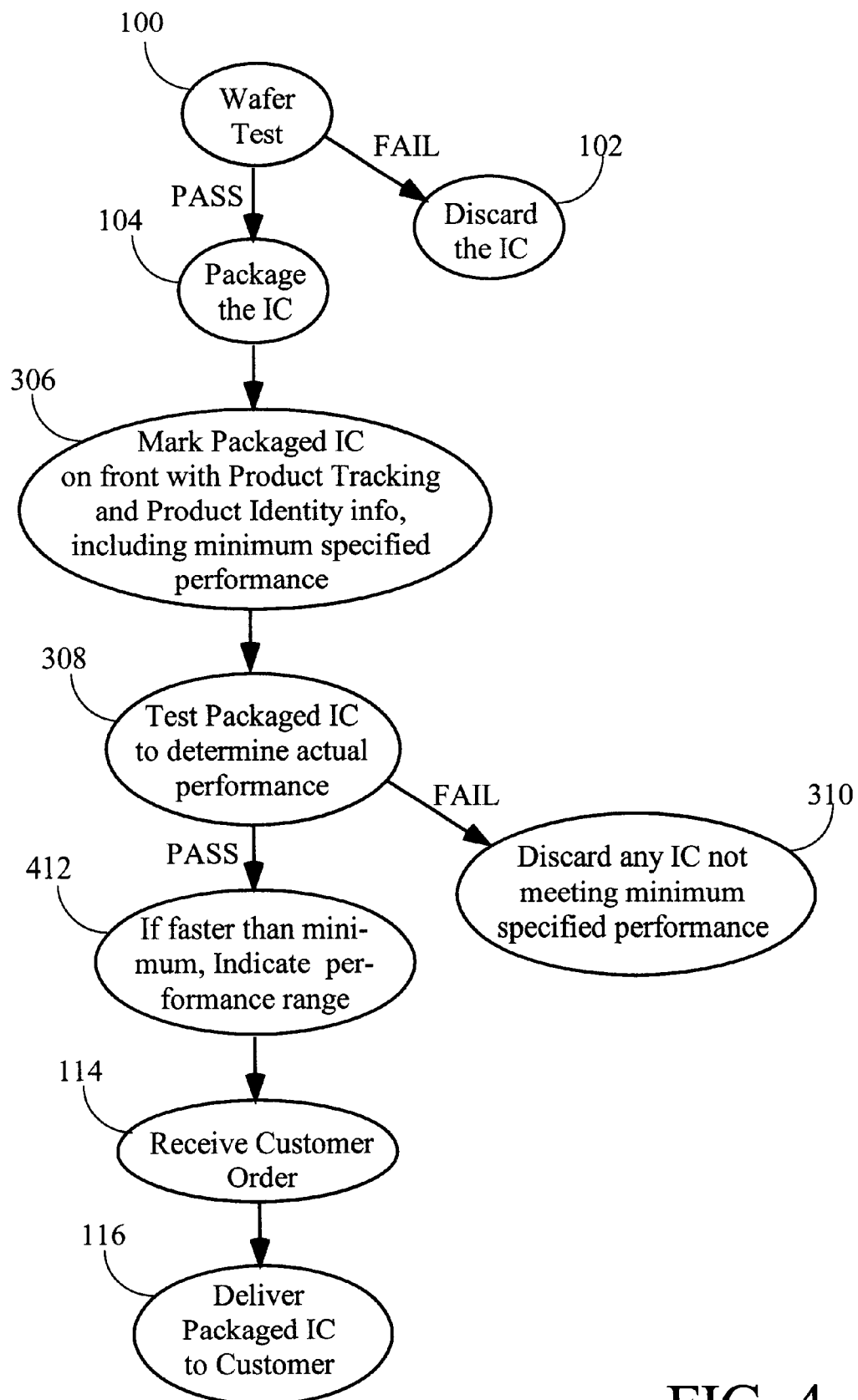
FIG. 4 shows the steps of a method for marking a packaged IC according to another embodiment of the invention.
Figure 4A:
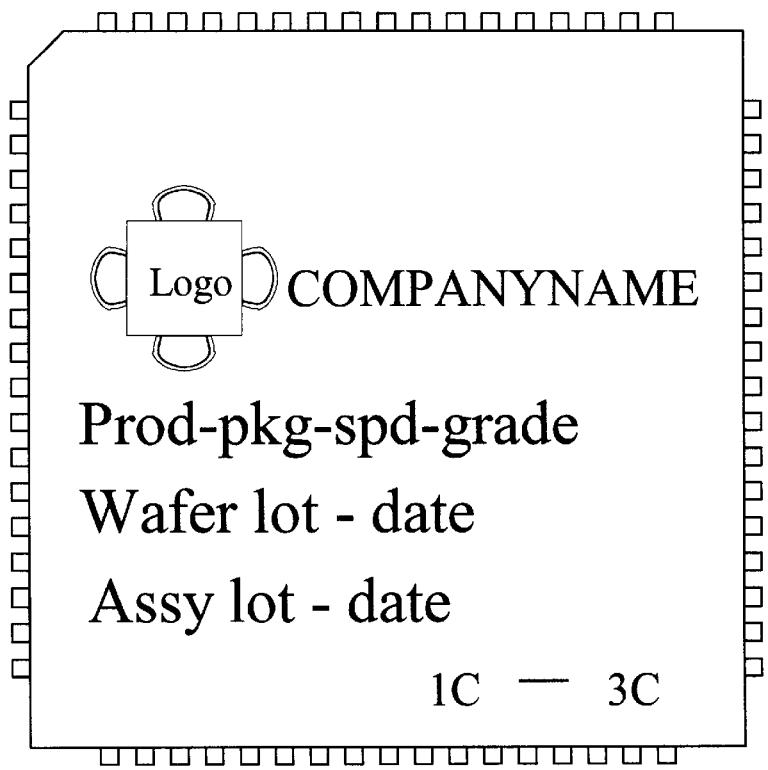
FIG. 4A shows the top side of a packaged IC after completing the method of FIG. 4.

FIG. 4 shows a variation on the method of FIG. 3. In this method, the second marking step (step 412) is used to mark, not all performances for which the IC qualifies, but a range of performances. For example, FIG. 4A shows the top side of a package IC marked with a range of "1C–3C". Therefore, as in FIG. 3B, this particular IC can be sold as either a 1C, 2C, or 3C product.

Figure 5:
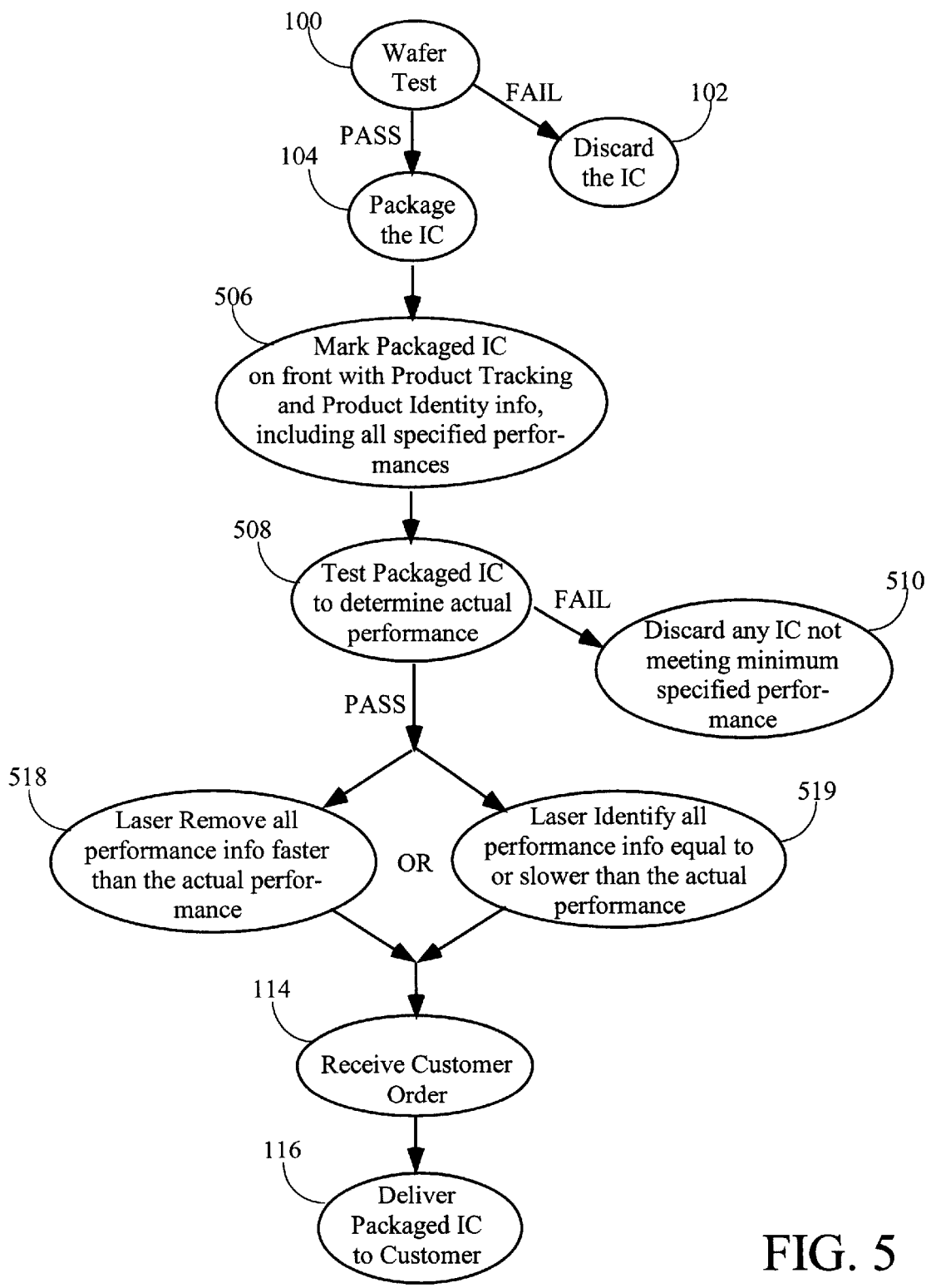
FIG. 5 shows the steps of a method for marking a packaged IC according to another embodiment, of the invention.
Figure 5A:
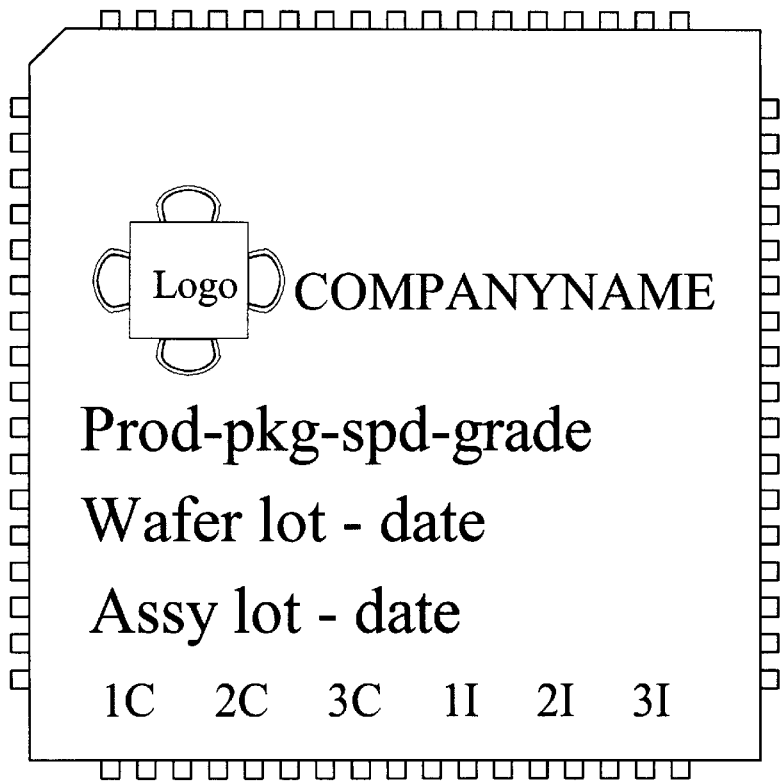
FIG. 5A shows the top side of a packaged IC after, the marking step of FIG. 5.

FIG. 5 shows a method for marking packaged ICs according to another embodiment of the present invention. According to the method of FIG. 5, at the first marking step (step 506) the packaged IC is marked with the product. tracking and product identity information, as shown in FIG. 5A. Every packaged IC is also marked with all specified performance combinations, whether or, not the IC is suitable for all standard performances. FIG. 5A shows a packaged IC marked with three speed grades (1, 2, and 3) in each of two temperature ranges (C and I).

Figure 5B:
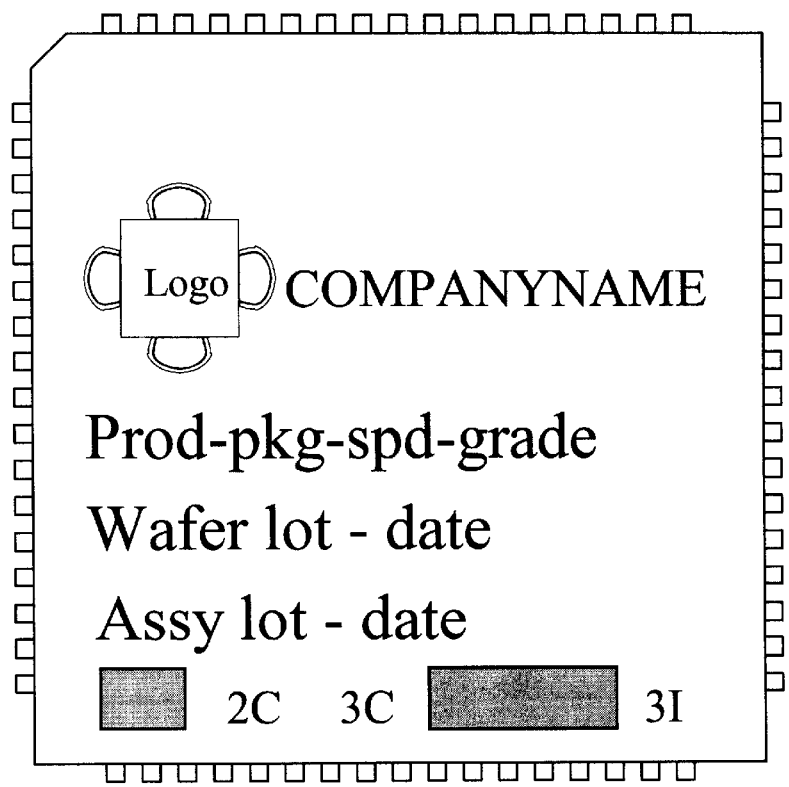
FIG. 5B shows the top side of the packaged IC of FIG. 5A after the laser removal step of FIG. 5.

At step 508, the marked packaged IC is tested to determine the actual performance. ICs failing to meet the minimum specified performance are discarded (step 510). In step 518, all performances (i.e., performance markings) NOT met by the packaged IC are removed from the package, preferably by laser eradication. FIG. 5B shows a packaged, IC after step 518 that can be sold as either a 2C, 3C, or 3I product.

Figure 5C:
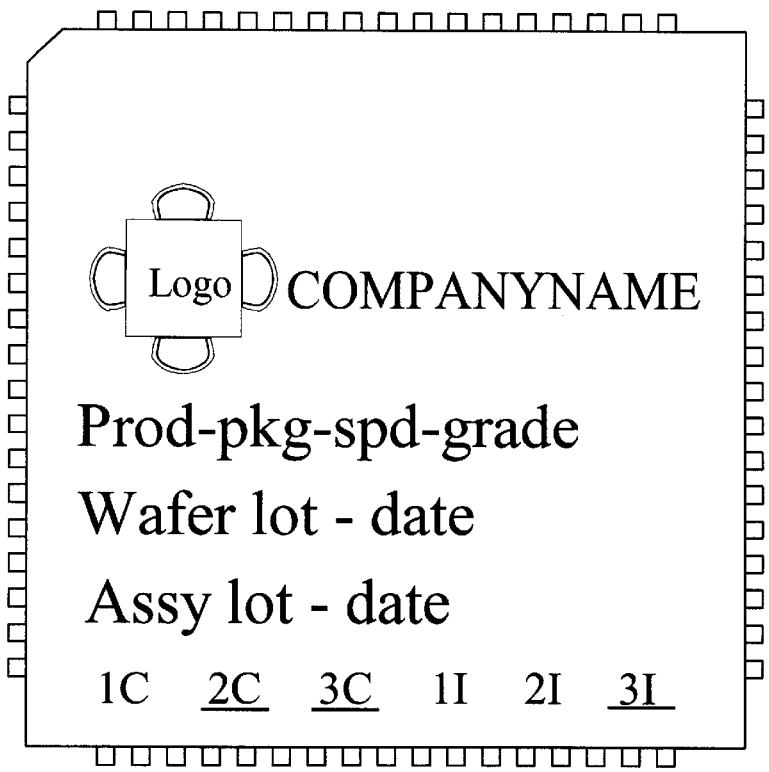
FIG. 5C shows the top side of the packaged IC of FIG. 5A after the laser identification (underlining) step of FIG. 5.
Figure 5D:
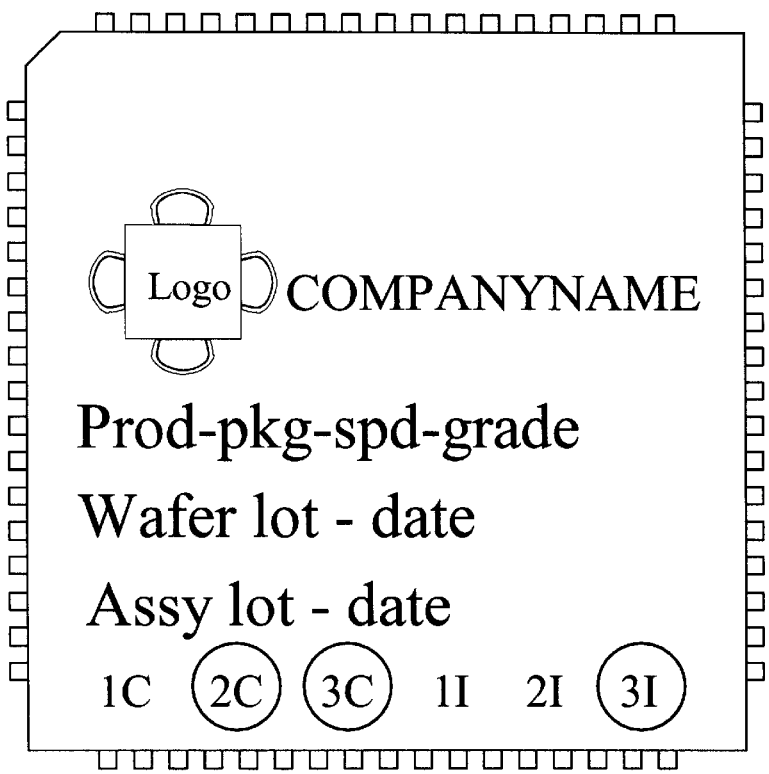
FIG. 5D shows the top side of the packaged IC of FIG. 5A after the laser identification (enclosing) step of FIG. 5.

In a variation on this method (also shown in FIG. 5, at step 519) all performances that ARE met by the packaged IC are highlighted in some way, for example, they are identified by being underlined with a laser marking (as in FIG. 5C) or enclosed by a laser marking (as in FIG. 5D). The packaged ICs in FIGS. 5C and 5D can also be sold as either 2C, 3C, or 3I products.

Figure 6:
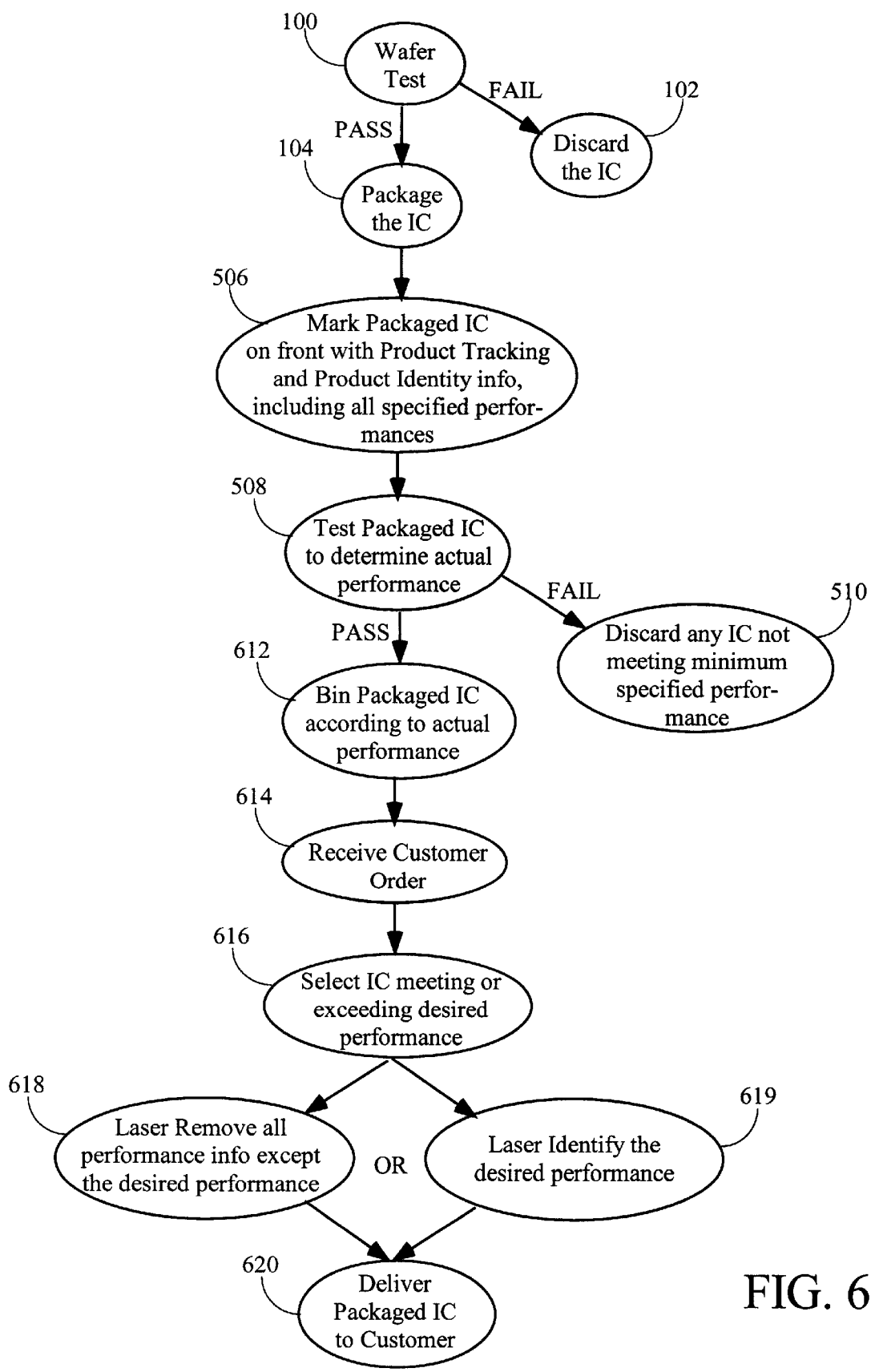
FIG. 6 shows the steps of a method for marking a packaged IC according to another embodiment of the invention.

FIG. 6 shows a method for marking packaged ICs according to another embodiment of the present invention. The early steps of this method are the same as in FIG. 5, so they are not described. After testing the packaged IC (step 508.) and discarding any IC not meeting the minimum specified performance (step 510), the marked packaged IC is binned (step 612) according to the actual performance of the IC. The IC is then held until a customer order is received (step 614). An IC meeting or exceeding the desired performance is selected (step 616). The desired performance is then marked on the selected packaged IC, either by . removing all other markings (step 618) or by identifying the desired performance (step 619). The IC is then delivered to the customer (step 620).

Figure 6A:
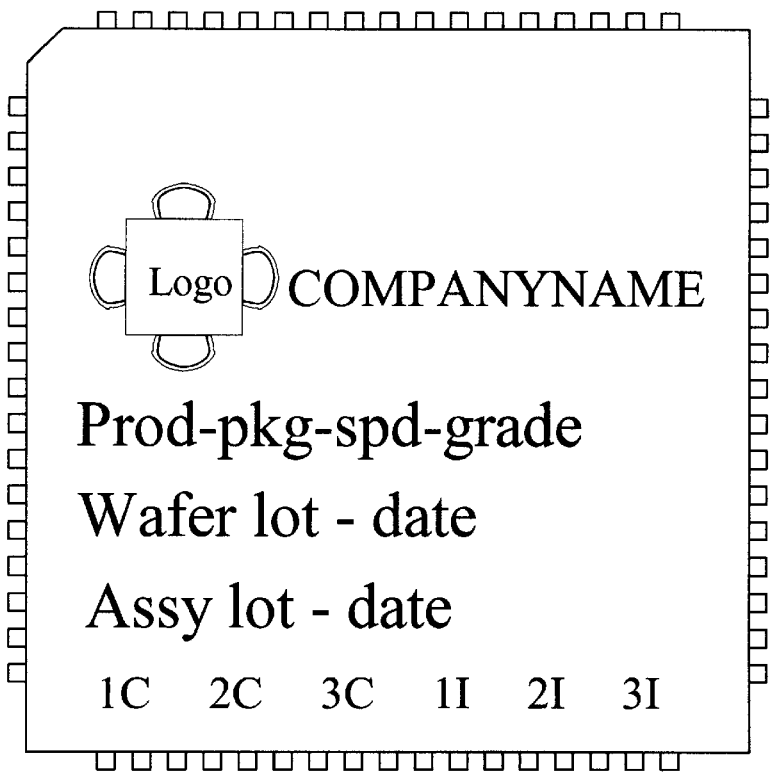
FIG. 6A shows the top side of a packaged IC after the marking step of FIG. 6.
Figure 6B:
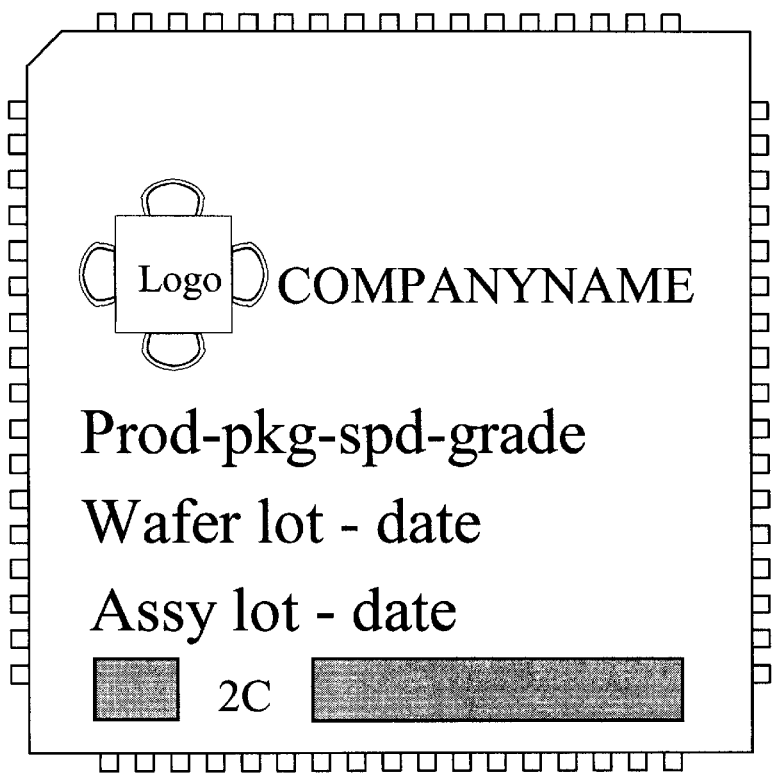
FIG. 6B shows the top side of the packaged IC of FIG. 6A after the laser removal step of FIG. 6.
Figure 6C:
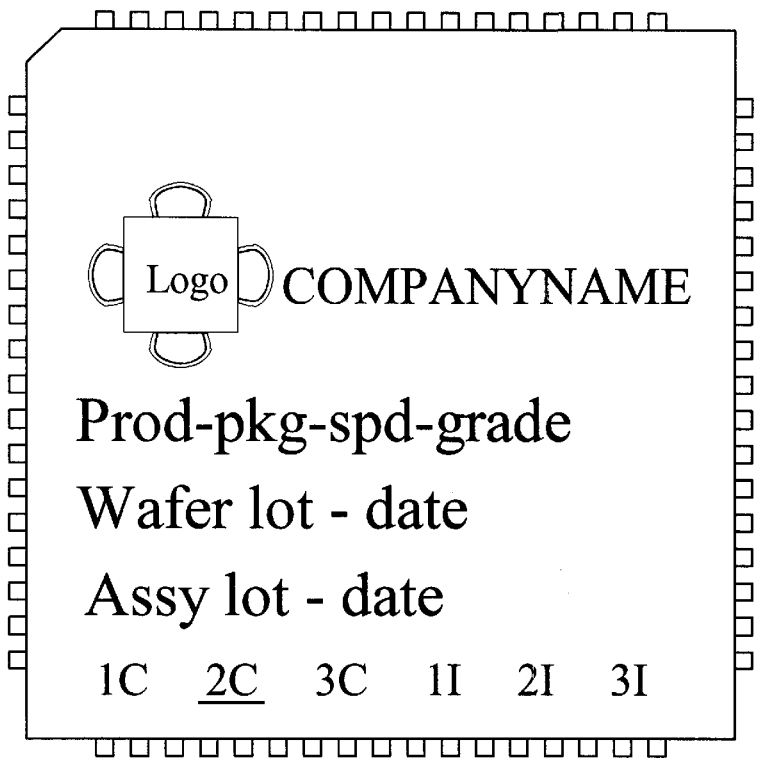
FIG. 6C shows the top side of the packaged IC of FIG. 6A after the laser identification (underlining) step of FIG. 6.
Figure 6D:
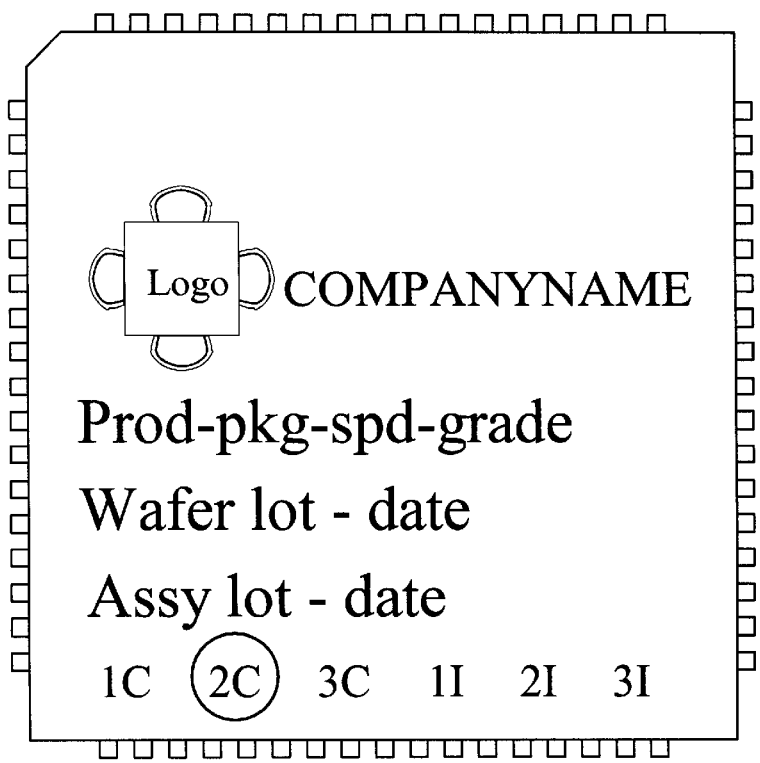
FIG. 6D shows the top side of the packaged IC of FIG. 6A after the laser identification (enclosing) step of FIG. 6.

FIG. 6A shows the packaged IC. after step 506, with all specified performances marked. FIG. 6B shows the packaged IC after step 618, when all but the desired performance have been removed. This customer has ordered a "2C" product. Note that this packaged IC could be the same IC shown in FIG. 5B, if the method of FIG. 5 were followed instead of the method of FIG. 6. FIGS. 6C and 6D show the same IC as FIG. 5B, if step 619 is followed instead of step 618. In FIG. 6C, the desired performance is underlined with a laser marking. In FIG. 6D, the desired performance is enclosed with a laser marking.

Those having skill in the relevant arts of the invention will now perceive various modifications and additions that may be made as a result of the disclosure herein. For example, product identity and product tracking information may be placed on either side of the package, product tracking information may be omitted, the nature and format of the performance information may be other than as described in the examples above, and so forth. Further, although many of the above examples describe the invention in terms of marking ICs with performance information inferior to that actually shown by the IC, the methods of the invention can also be applied to other uses, such as meeting special marking requests, or marking information other than performance-related information. Accordingly, all such modifications and additions are deemed to be within the scope of the invention, which is to be limited only by the appended claims and their equivalents.

What is claimed is:

1. A method for marking a packaged IC having an actual performance, the method comprising:

marking all specified performances on the packaged IC;

testing the packaged IC to determine the actual performance; and removing from the packaged IC all performances faster than the actual performance.

2. The method of claim 1, wherein the step of removing is performed with a laser.

3. The method of claim 1, further comprising:

receiving an order for a packaged IC with a desired performance; and if the desired performance is marked on the packaged IC, supplying the packaged IC in response to the order.

4. A method for marking a packaged,IC having an actual performance, the method comprising:

marking all specified performances on the packaged IC;

testing the packaged IC to determine the actual performance; and identifying on the packaged IC all performances equal to or slower than the actual performance.

5. The method of claim 4, wherein the step of identifying is performed with a laser.

6. The method of claim 5, wherein the step of identifying comprises underlining with a laser marking.

7. The method of claim 5, wherein the step of identifying comprises enclosing with a laser marking.

8. The method of claim 4, further comprising:

receiving an order for a packaged IC with a desired performance; and if the desired performance is identified on the packaged IC, supplying the packaged IC in response to the order.

9. A method for marking a packaged IC having an actual performance, the method comprising:

marking all specified performances on the packaged IC;

testing the packaged IC to determine the actual performance;

binning the packaged IC based on the actual performance;

receiving an order for a packaged IC with a desired performance not exceeding the actual performance of the binned packaged IC;

removing from the packaged IC all performances except the desired performance; and supplying the packaged IC in response to the order.

10. The method of claim 9, wherein the step of removing is performed with a laser.

11. A method for marking a packaged IC having an actual performance, the method comprising:

marking all specified performances on the packaged IC;

testing the packaged IC to determine the actual performance;

binning the packaged IC based on the actual performance;

receiving an order for a packaged IC with a desired performance not exceeding the actual performance of the binned packaged IC;

identifying the desired performance on the packaged IC; and supplying the packaged IC in response to the order.

12. The method of claim 11, wherein the step of identifying is performed with a laser.

13. The method of claim 12, wherein the step of identifying comprises underlining with a laser marking.

14. The method of claim 12, wherein the step of identifying comprises enclosing with a laser marking.

* * * * *